(12) United States Patent
Chu et al.

(10) Patent No.: US 10,756,171 B2
(45) Date of Patent: Aug. 25, 2020

(54) INTEGRATED CIRCUIT DEVICE WITH SOURCE/DRAIN BARRIER

(71) Applicant: Taiwan Semiconductor Manufacturing Co., Ltd., Hsinchu (TW)

(72) Inventors: Feng-Ching Chu, Hsinchu (TW); Wei-Yang Lee, Taipei (TW); Yen-Ming Chen, Hsin-Chu County (TW); Feng-Cheng Yang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/217,102

(22) Filed: Dec. 12, 2018

(65) Prior Publication Data

US 2019/0131392 A1    May 2, 2019

Related U.S. Application Data

(63) Continuation of application No. 15/796,968, filed on Oct. 30, 2017, now Pat. No. 10,217,815.

(51) Int. Cl.
*H01L 29/06* (2006.01)
*H01L 29/66* (2006.01)
(Continued)

(52) U.S. Cl.
CPC .... *H01L 29/0653* (2013.01); *H01L 21/02057* (2013.01); *H01L 21/02227* (2013.01);
(Continued)

(58) Field of Classification Search
CPC ..... H01L 21/020557; H01L 21/022227; H01L 21/306004; H01L 29/0653; H01L 29/0847;
(Continued)

(56) References Cited

U.S. PATENT DOCUMENTS 8,772,109 B2    7/2014    Colinge
8,785,285 B2    7/2014    Tsai et al.
(Continued)

FOREIGN PATENT DOCUMENTS

KR    20160037710    4/2016
TW    201637207    10/2016

*Primary Examiner* — Christine A Enad
(74) *Attorney, Agent, or Firm* — Haynes and Boone, LLP

(57) ABSTRACT

Various examples of an integrated circuit device and a method for forming the device are disclosed herein. In an example, a method includes receiving a workpiece that includes a substrate, and a device fin extending above the substrate. The device fin includes a channel region. A portion of the device fin adjacent the channel region is etched, and the etching creates a source/drain recess and forms a dielectric barrier within the source/drain recess. The workpiece is cleaned such that a bottommost portion of the dielectric barrier remains within a bottommost portion of the source/drain recess. A source/drain feature is formed within the source/drain recess such that the bottommost portion of the dielectric barrier is disposed between the source/drain feature and a remainder of the device fin.

20 Claims, 8 Drawing Sheets

(51) Int. Cl.
*H01L 29/08* (2006.01)
*H01L 21/02* (2006.01)
*H01L 29/78* (2006.01)
*H01L 21/306* (2006.01)
*H01L 21/3065* (2006.01)

(52) U.S. Cl.
CPC .... *H01L 21/30604* (2013.01); *H01L 29/0847* (2013.01); *H01L 29/66636* (2013.01); *H01L 29/66795* (2013.01); *H01L 29/7848* (2013.01); *H01L 29/7851* (2013.01); *H01L 21/3065* (2013.01)

(58) Field of Classification Search
CPC ......... H01L 29/66636; H01L 29/66795; H01L 29/7851
See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,034,700 B1 | 5/2015 | Jeong et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2009/0289288 A1* | 11/2009 | Wu ................... H01L 27/10855 257/296 |
| 2013/0020640 A1 | 1/2013 | Chen et al. |
| 2013/0200444 A1* | 8/2013 | Wang ................ H01L 21/02115 257/288 |
| 2015/0035018 A1* | 2/2015 | Liu ....................... H01L 29/785 257/288 |
| 2016/0056290 A1* | 2/2016 | Tsai .................. H01L 21/02639 257/192 |
| 2016/0190128 A1* | 6/2016 | Suk ..................... H01L 27/0886 257/401 |
| 2017/0278962 A1 | 9/2017 | Chien et al. |

\* cited by examiner

INTEGRATED CIRCUIT DEVICE WITH SOURCE/DRAIN BARRIER

The present application is a continuation application of U.S. patent application Ser. No. 15/796,968, filed Oct. 30, 2017, which is incorporated herein by reference in its entirety.

BACKGROUND

The semiconductor industry has progressed into nanometer technology process nodes in pursuit of higher device density, higher performance, and lower cost. Beyond merely shrinking devices, circuit designers are looking to novel structures to deliver even greater performance. One avenue of inquiry is the development of three-dimensional designs, such as a Fin-like Field Effect Transistor (FinFET). A FinFET may be envisioned as a typical planar device extruded out of a substrate and into the gate. An exemplary FinFET is fabricated with a thin "fin" (or fin structure) extending up from a substrate. The channel region of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

Because of the complexity inherent in FinFETs and other nonplanar devices, fabrication techniques are still being developed to reduce size, improve efficiency, and increase speed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
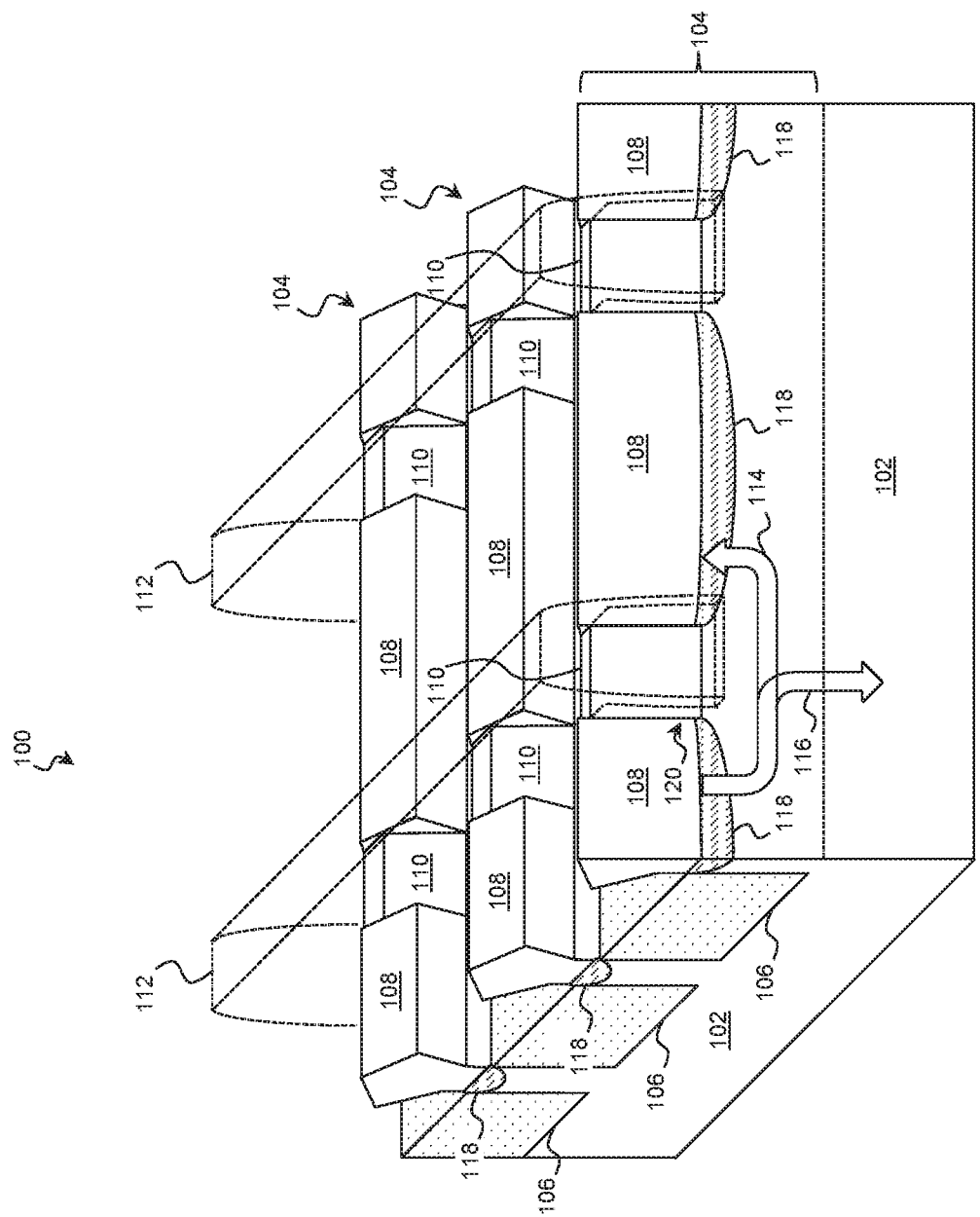
FIG. 1 is a perspective view of a portion of a workpiece according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Advances in integrated circuit design and fabrication have delivered improvements in circuit speed and efficiency. However, despite new structures and new fabrication techniques, transistors and other circuit elements still experience losses and inefficiencies. In many cases, parasitic effects, such as leakage, hot carrier injection, tunneling, drain-induced barrier lowering, and others, have a greater impact with each generation of improvements because the new techniques form smaller devices that operate at lower voltages. These parasitic effects may waste energy, produce excess heat, reduce maximum operating frequency, and/or increase minimum operating voltage. In extreme cases, they may lead to premature device failure.

One example is leakage current, the unintentional flow of carriers (such as when the device is in the off-state) that includes source-to-drain leakage, pn junction leakage, source (or drain)-to-bulk punch through. Because some types of leakage increase as channel length decreases, the leakage current may limit attempts to shrink the size of the device.

To address leakage and other parasitic effects, some examples of the present disclosure provide a transistor, such as a Fin-like Field Effect Transistor (FinFET), with dielectric barriers at the base of the transistor's source/drain features. The dielectric barriers electrically insulate the bottommost portions of the source/drain features to inhibit leakage current from flowing around the channel region or from flowing into the bulk of the substrate. The sides of the source/drain features may be free of the dielectric barrier to permit the flow of carriers through the channel region. In contrast to a buried dielectric layer, the dielectric barriers may be physically separate from each other and may be formed in the source/drain regions exclusively.

The dielectric barriers may reduce multiple types of leakage current, and many examples provide improved efficiency, reduced heat, and/or increased switching frequency. In some examples, the dielectric barriers permit forming transistors with smaller channel lengths and thereby improve device density. However, unless otherwise noted, no embodiment is required to provide any particular advantage.

FIG. 1 is a perspective view of a portion of a workpiece 100 according to various aspects of the present disclosure. The perspective view of FIG. 1 has been sectioned along the longitudinal length of a fin. FIG. 1 has been simplified for the sake of clarity and to better illustrate the concepts of the present disclosure. Additional features may be incorporated into the workpiece 100, and some of the features described below may be replaced or eliminated for other embodiments of the workpiece 100.

The workpiece 100 includes a substrate 102 with one or more device fins 104 formed upon it and separated by isolation features 106. The device fins 104 are representative of any raised feature, and while the illustrated embodiments include FinFET device fins 104, further embodiments include other raised active and passive devices formed upon the substrate 102. Each FinFET device fin 104 may include any number of FinFETs that, in turn, each include a pair of opposing source/drain features 108 separated by a channel region 110. As seen in FIG. 1, the source/drain features 108 and channel region 110 rise above the plane of the substrate 102 upon which they are formed and above the isolation features 106. Accordingly, the circuit devices formed on the device fins 104 may be referred to as "nonplanar" devices.

The flow of carriers (electrons for an n-channel FinFET and holes for a p-channel FinFET) through the channel region 110 of a FinFET is controlled by a voltage applied to a gate stack 112 adjacent to and overwrapping the channel region 110. The gate stack 112 is shown as translucent to better illustrate the underlying channel region 110. The raised channel region 110 provides a larger surface area proximate to the gate stack 112 than comparable planar devices. This strengthens the electromagnetic field interactions between the gate stack 112 and the channel region 110, which may reduce leakage and short channel effects associated with smaller devices. Thus in many embodiments, FinFETs and other nonplanar devices deliver better performance in a smaller footprint than their planar counterparts do.

Despite a FinFET's enhanced control over the channel, it has been determined that leakage current may still flow from the source/drain features 108. One avenue for the flow of carriers is out through the base of a first source/drain feature 108, through the substrate 102 underneath the channel region, and in through the base of a second source/drain feature 108. This potential leakage path is indicated by arrow 114 in FIG. 1. Because the gate stack 112 does not extend to down to the leakage path, the gate stack 112 may not be able to prevent this unintended flow of carriers even when the device is in an off-state. Another avenue for the flow of carriers is out from the base of a source/drain feature 108 and through the bulk of the substrate 102 as indicated by arrow 116.

To reduce potential leakage current through base of the source/drain features 108, in some examples, the workpiece 100 includes a dielectric barrier 118 disposed between the base of each source/drain feature 108 and the remainder of the fin 104 that inhibits the flow of carriers. To allow the normal function of the transistor, the vertical surfaces of the source/drain features 108 (such as surface 120) adjacent the channel region 110 are free of the dielectric barrier 118 so that the vertical surfaces of the source/drain features 108 physically contact the channel region 110. This allows carriers to flow through the portions of the channel region 110 under control of the gate stack 112 while inhibiting the flow of carriers through the substrate 102, the device fin 104, and/or the portions of the channel region 110 that are not sufficiently under control of the gate stack 112.

It is noted that the dielectric barriers 118 may be physically separate from each other. In some examples described below, this is because the dielectric barriers 118 are created during the formation of the source/drain features 108. The process forms each dielectric barrier 118 in the region between the respective source/drain feature 108 and the portion of the fin 104 or substrate 102 directly underneath the source/drain feature 108. In other words, in some examples, the dielectric barriers 118 do not extend underneath the channel region 110.

Figure 2:
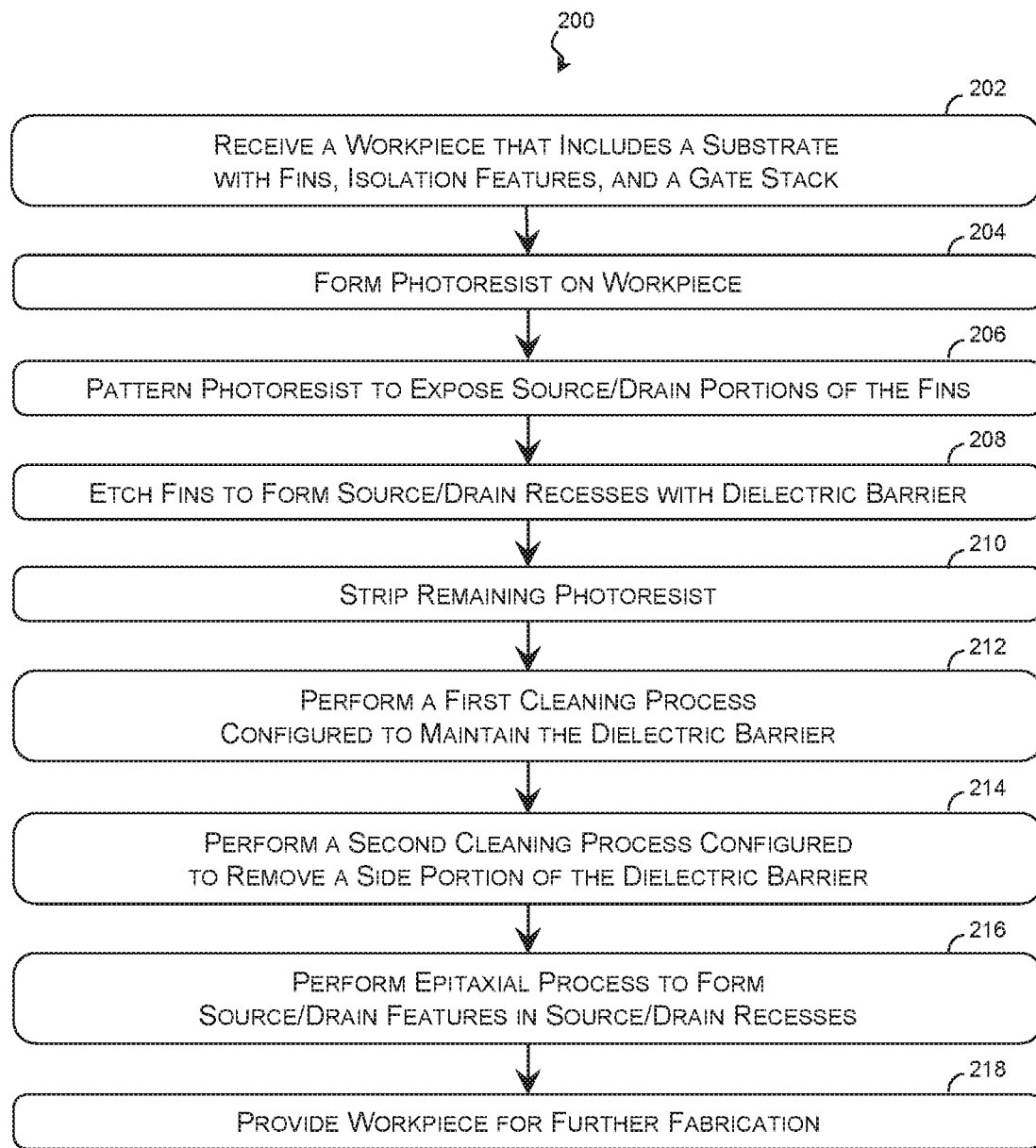
FIG. 2 is a flow diagram of a method for fabricating a FinFET device on a workpiece according to various aspects of the present disclosure.
Figure 3:
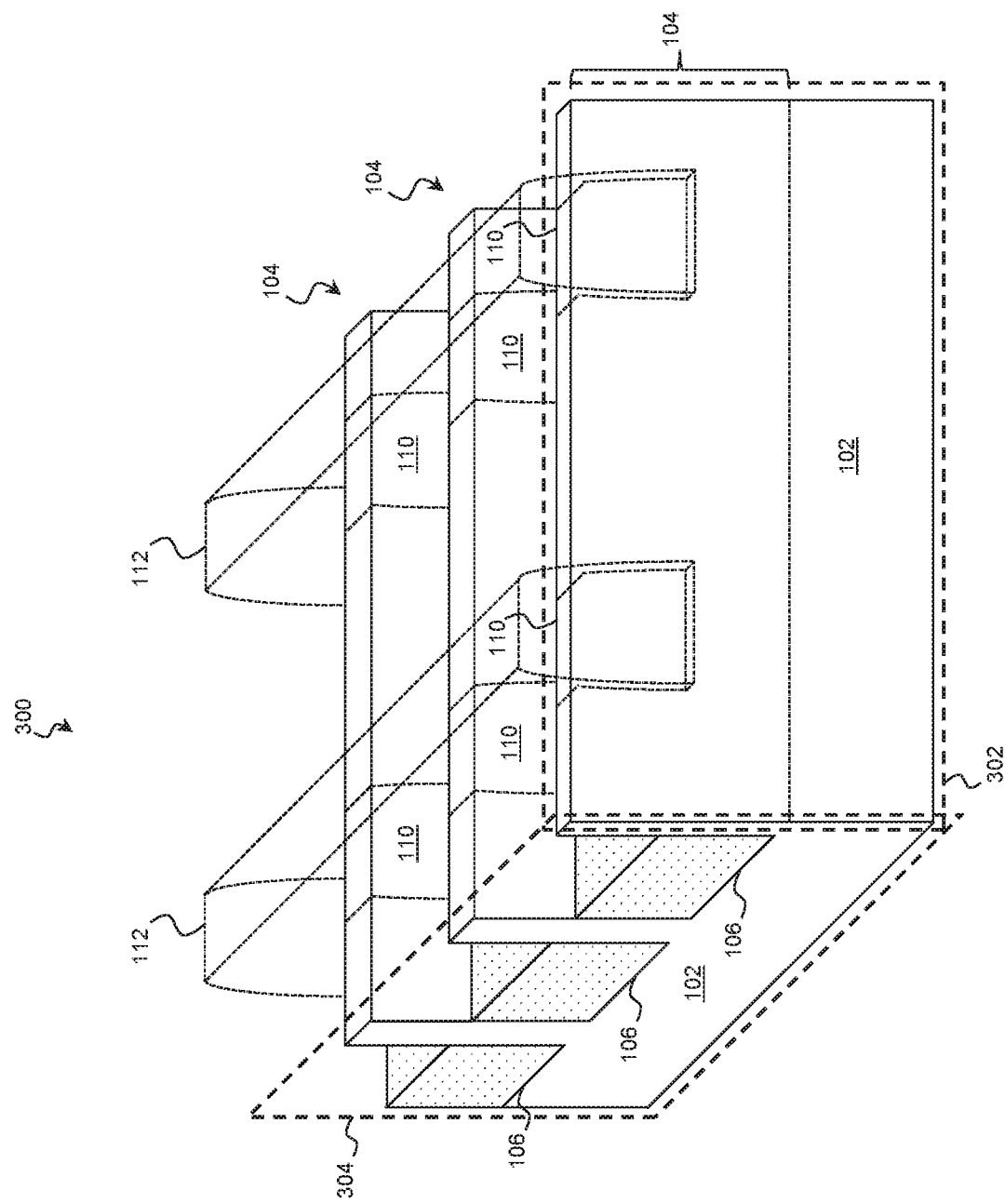
FIG. 3 is a perspective view of a portion of a workpiece according to various aspects of the present disclosure.

Exemplary methods of forming FinFETs with a dielectric barrier 118 will now be described with reference to FIGS. 2-10. In particular, FIG. 2 is a flow diagram of a method 200 for fabricating a FinFET device on a workpiece according to various aspects of the present disclosure. It is understood that additional steps can be provided before, during, and after the method 200 and that some of the steps described can be replaced or eliminated for other embodiments of the method. FIG. 3 is a perspective view of a portion of the workpiece 300 according to various aspects of the present disclosure. FIG. 3 is sectioned along the longitudinal length of a fin 104. FIGS. 4-9 are cross-sectional views of a portion of the workpiece 300 taken along a device fin (along plane 302 of FIG. 3) according to various aspects of the present disclosure. FIG. 10 is a cross-sectional view of the portion of the workpiece taken along a source/drain region (along plane 304 of FIG. 3) according to various aspects of the present disclosure. FIGS. 3-10 have been simplified for the sake of clarity and to better illustrate the concepts of the present disclosure. Except where noted, the elements of FIGS. 3-10 may be substantially similar to those of FIG. 1.

Referring first to block 202 of FIG. 2 and to FIG. 3, a workpiece 300 is received that includes a substrate 102 upon which fins 104 are disposed. In various examples, the substrate 102 includes an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof.

The substrate 102 may be uniform in composition or may include various layers. The layers may have similar or different compositions. For example, a silicon-on-insulator (SOI) substrate 102 includes an insulator layer, such as a semiconductor oxide, a semiconductor nitride, a semiconductor oxynitride, a semiconductor carbide, and/or other suitable insulator materials for electrical isolation. In further examples, the substrate 102 includes layers with different semiconductor lattice arrangements to induce device strain and thereby tune device performance.

The fins 104 are disposed on the substrate 102 and may be formed by etching portions of the substrate 102, by depositing various layers on the substrate 102 and etching the layers, and/or by other suitable techniques. The fins 104 may be similar in composition to the substrate 102 or may be different therefrom. For example, in some embodiments, the substrate 102 may include primarily silicon, while the fins 104 include one or more layers that are primarily germanium or a SiGe compound semiconductor. In some embodiments, the substrate 102 includes a SiGe compound semiconductor, and the fins 104 include one or more layers that include a SiGe compound semiconductor with a different ratio of silicon to germanium.

The workpiece 300 may include gate stacks 112 disposed over channel regions 110 of the fins 104. The gate stacks 112 are disposed on the top surface of the fins 104 and may also extend along the side surfaces of the fins 104. Because the gate stacks 112 surround the fins 104, more of the channel region 110 is proximate to the gate stack 112 than in a conventional planar device.

Figure 4:
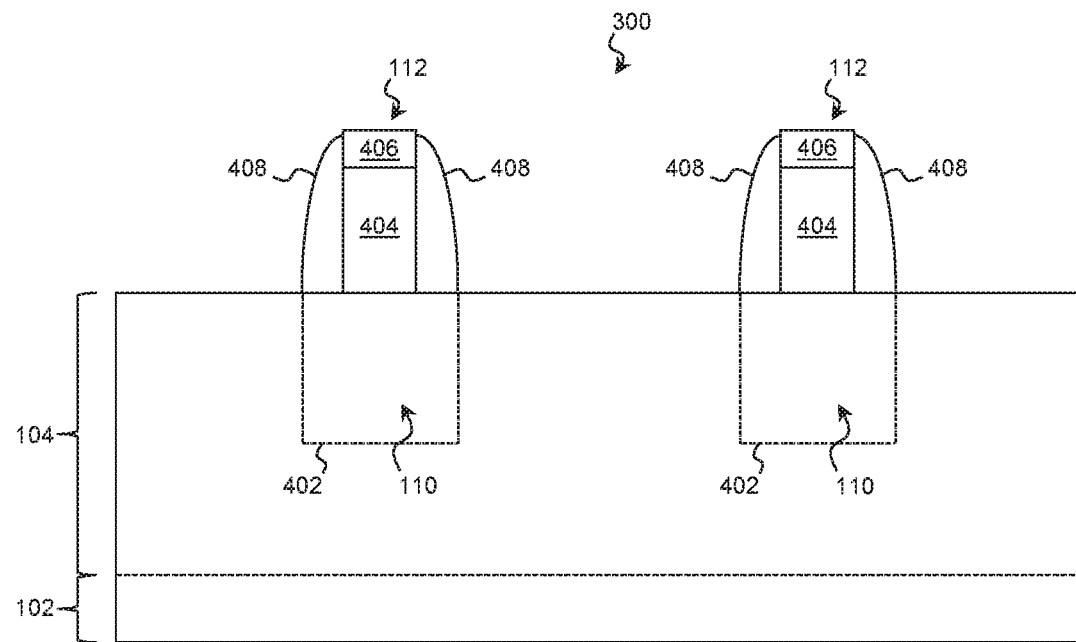
FIGS. 4-9 are cross-sectional views of a portion of a workpiece taken along a device fin according to various aspects of the present disclosure.
Figure 5:
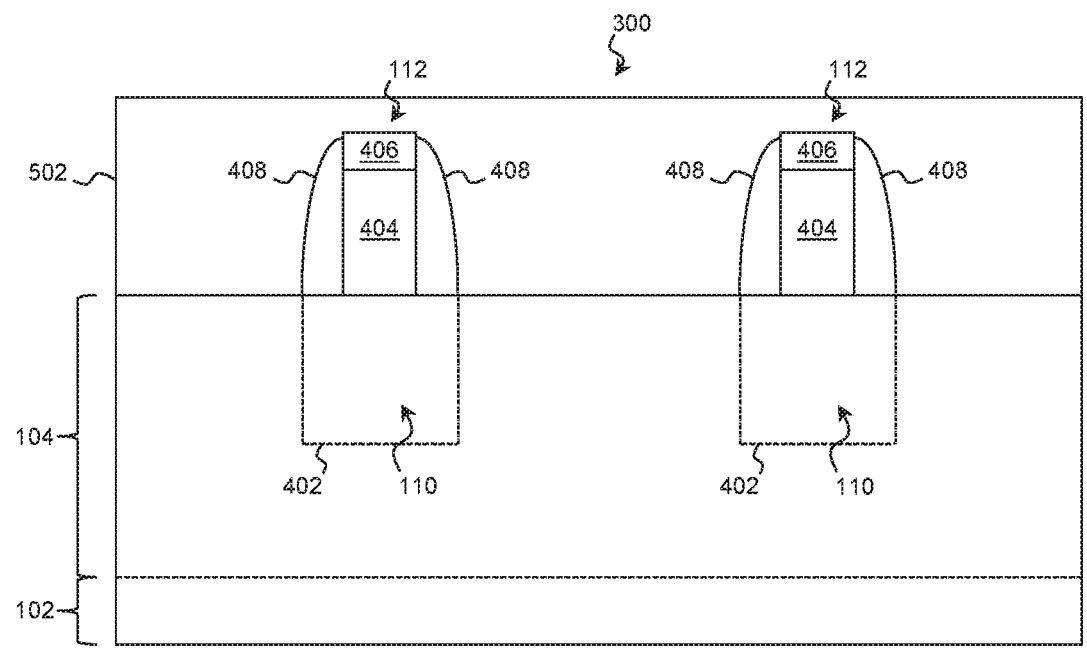

The gate stacks 112 are shown in more detail in FIG. 4. The gate stacks 112 are disposed on top of the channel regions 110 of the fins 104 and extend along the vertical sidewalls of the channel regions 110 of the fins 104. In the context of FIG. 4, outline 402 represents the relative position of the portion of a gate stack 112 that extends along a side surface of the fin 104 out of the cross-sectional plane.

A finished gate stack 112 may include an interfacial layer disposed on the channel region 110, a gate dielectric disposed on the interfacial layer, a gate electrode disposed on the gate dielectric, and/or other suitable elements. However, at this point in the method 200, the gate stack 112 may include placeholder elements. For example, in a gate-last process, the gate stack 112 includes a temporary gate electrode 404 used as a placeholder during some of the fabrication processes. The temporary/placeholder gate electrode 404 is subsequently removed and replaced with an interfacial layer, a gate dielectric, a functional gate electrode, and/or other gate elements. A gate-last process may be used when the functional gate materials are sensitive to some fabrication processes, such as annealing. Accordingly in some examples, when the workpiece 300 is received, the gate stacks 112 include placeholder gate electrodes 404. A placeholder gate electrode 404 may include polysilicon, dielectric material, and/or other suitable materials. In contrast, a functional gate electrode that will replace the placeholder gate electrode 404 may include tungsten, aluminum, copper, titanium, tantalum, molybdenum, ruthenium, tantalum nitride, nickel silicide, cobalt silicide, TiN, WN, TiAl, TiAlN, TaCN, TaC, TaSiN, metal alloy, other suitable materials, and/or combinations thereof.

Each gate stack 112 may include a capping layer 406 disposed on a top surface of the gate electrode 404. The capping layer 406 protects the gate electrode 404 during fabrication processes such as etching. In various examples, the capping layer 406 includes a dielectric material (e.g., semiconductor oxides, semiconductor nitrides, semiconductor oxynitrides, semiconductor carbides, semiconductor oxycarbonitrides, etc.), and/or other suitable materials. In one embodiment, the capping layer 406 includes silicon carbide.

The gate stacks 112 may also include gate spacers 408 or sidewall spacers disposed on the side surfaces of the gate electrode 404. Similar to the capping layer 406, the gate spacers 408 may protect the gate electrode 404 and may be used to offset subsequently formed source/drain features and to control the source/drain structure (junction) profile. In various examples, the gate spacers 408 include dielectric materials (e.g., semiconductor oxides, semiconductor nitrides, semiconductor oxynitrides, semiconductor carbides, semiconductor oxycarbonitrides, etc.), and/or other suitable materials, and are different in composition and etchant sensitivity from the capping layers 406. In one embodiment, the gate spacers 408 each include one or more layers of silicon nitride and/or silicon oxide.

To form the source/drain features 108 on opposing sides of the channel region 110, portions of the fins 104 may be etched and the source/drain features 108 may be epitaxially grown in the resulting recesses. Referring to block 204 of FIG. 2 and to FIG. 5, a photoresist layer 502 is deposited on the workpiece 300. An exemplary photoresist layer 502 includes a photosensitive material that causes the layer to undergo a property change when exposed to light. This property change can be used to selectively remove exposed or unexposed portions of the photoresist layer in a process referred to as lithographic patterning.

Figure 6:
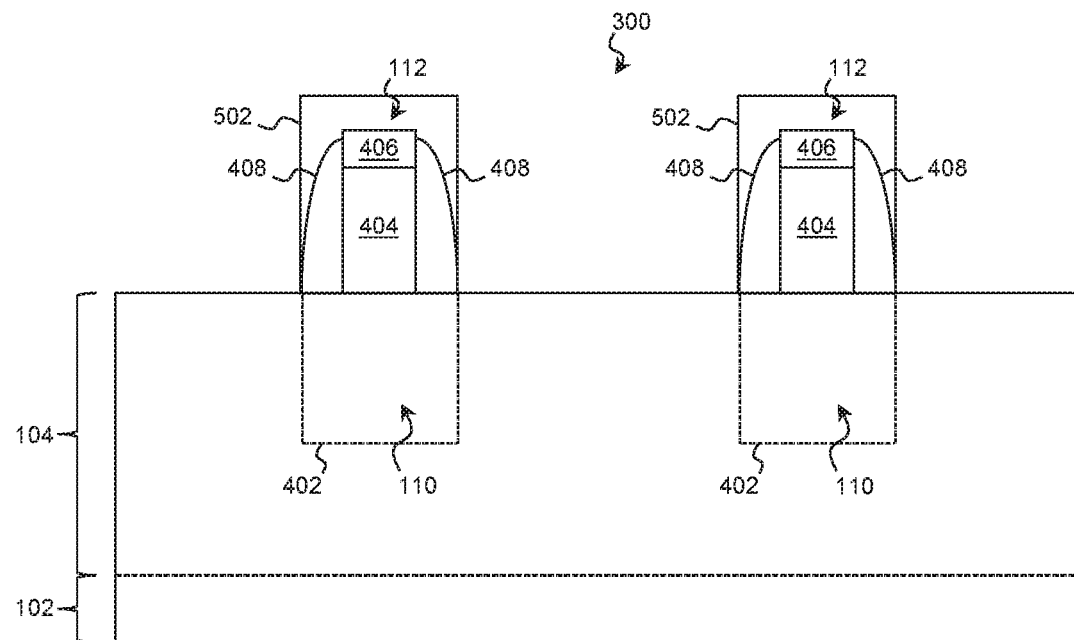

Referring to block 206 of FIG. 2 and to FIG. 6, the photoresist layer is patterned to expose source/drain portions of the fins 104. In one such embodiment, a photolithographic system exposes the photoresist layer 502 to radiation in a particular pattern determined by a mask. Light passing through or reflecting off the mask strikes the photoresist layer 502 thereby transferring a pattern formed on the mask to the photoresist 502. In other such embodiments, the photoresist layer 502 is exposed using a direct write or maskless lithographic technique, such as laser patterning, e-beam patterning, and/or ion-beam patterning. Once exposed, the photoresist layer 502 is developed leaving the exposed portions of the resist, or in alternative examples, leaving the unexposed portions of the resist. An exemplary patterning process includes soft baking of the photoresist layer 502, mask aligning, exposure, post-exposure baking, developing the photoresist layer 502, rinsing, and drying (e.g., hard baking). The patterned photoresist layer 502 exposes portions of the fins 104 to be etched.

Figure 7:
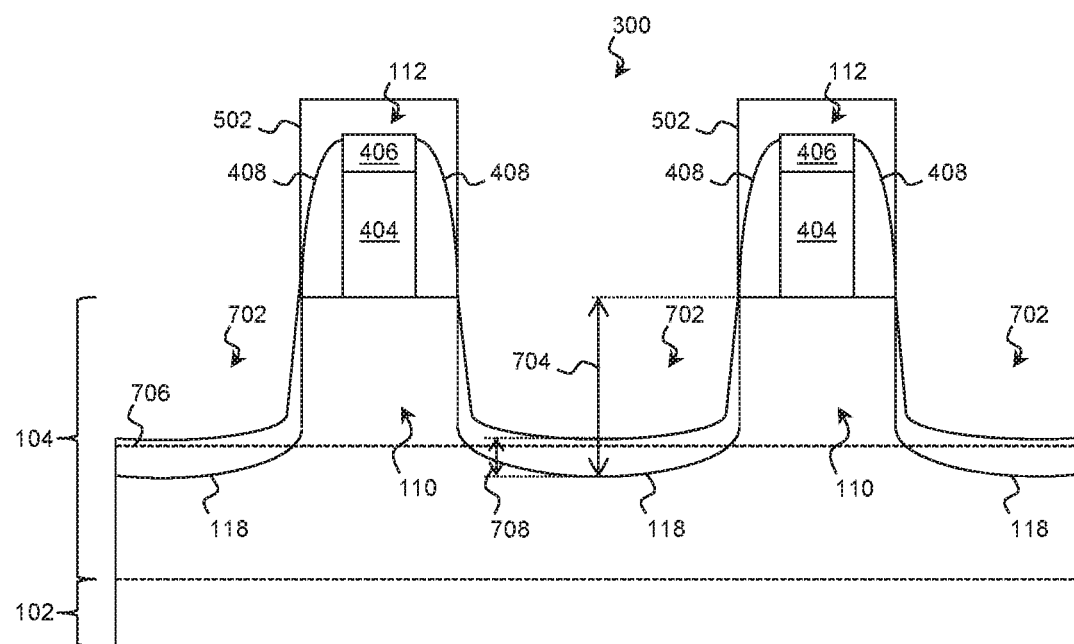

Referring to block 208 of FIG. 2 and to FIG. 7, an etching process is performed on the workpiece 300 to create source/drain recesses 702. The etching processes may include any suitable etching technique such as wet etching, dry etching, Reactive Ion Etching (RIE), ashing, and/or other etching methods. In some embodiments, the etching process includes dry etching using an oxygen-based etchant, a fluorine-based etchant (e.g., $CF_4$, $SF_6$, $CH_2F_2$, $CHF_3$, and/or $C_2F_6$), a chlorine-based etchant (e.g., $C_{12}$, $CHC_{13}$, $CCl_4$, and/or $BCl_3$), a bromine-based etchant (e.g., HBr and/or $CHBR_3$), an iodine-based etchant, other suitable etchant gases or plasmas, and/or combinations thereof. In some embodiments, the etching process includes wet etching using diluted hydrofluoric acid (DHF), potassium hydroxide (KOH) solution, ammonia, hydrofluoric acid (HF), nitric acid ($HNO_3$), acetic acid ($CH_3COOH$), and/or other suitable wet etchant(s). In some examples, the etchant is selected to etch the fins 104 without significantly etching surrounding structures such as the outer materials of the gate stack 112 (e.g., the capping layer 406 or the gate spacers 408) or the isolation features 106. This may allow the etching to be performed even if the patterned photoresist layer 502 is not perfectly aligned.

The etching process may recess the fins 104 to any suitable depth as measured from the top surface of the channel region 110 of the fin 104 to the bottommost point on the surface of the fin 104 within source/drain recesses 702 (as indicated by marker 704). In some examples, the etching process is controlled to stop etching when the source/drain recesses 702 (excluding the dielectric barriers 118 discussed in more detail below) are below the topmost surface of the isolation features 106 (indicated by dashed line 706 because the isolation features 106 may be out of the cross-sectional plane) and accordingly, the bottommost surface of the gate stack 112 (also indicated by dashed line 706). In some examples, the etching process is controlled to stop etching when the source/drain recesses 702 (excluding the dielectric barriers 118) are substantially coplanar with the top surface of the isolation features 106. In yet further examples, the etching process is controlled to stop etching when the source/drain recesses 702 (excluding the dielectric barriers 118) are above the top surface of the isolation features 106.

In some such examples, where a fin 104 extends between about 45 nm and about 60 nm above the isolation features 106, the etching process may be controlled to etch to a depth (indicated by marker 704) between about 50 nm and about 65 nm from the top of the fin 104. Accordingly in various examples, the lowest point on the surface of the fin 104 within the source/drain recesses 702 is between about 5 nm and about 10 nm below the top surface of the isolation features 106 and accordingly, the bottom surface of the gate stack 112. In further examples, the lowest point on the surface of the fin 104 within the source/drain recesses 702 substantially coplanar with the top surface of the isolation features 106. In yet further examples, the lowest point on the surface of the fin 104 within the source/drain recesses 702 is between about 5 nm and about 10 nm above the top surface of the isolation features 106.

As can be seen in FIG. 7, the etching process may form dielectric barriers 118 within the source/drain recesses 702. The dielectric barriers 118 may include a native oxide and/or other dielectric material (e.g., semiconductor oxides, semiconductor hydroxides, semiconductor nitrides, semiconductor oxynitrides, semiconductor carbides, semiconductor oxycarbonitrides, etc.) produced when the etchant and ambient chemicals react with the semiconductor of the fin 104. For example, the dielectric barrier 118 may include carbon, hydrogen, or oxygen from an etchant; nitrogen from an ambient gas; and/or carbon, hydrogen, oxygen, or nitrogen from remnants of a photoresist. In some examples, the dielectric barriers 118 include primarily a semiconductor oxide such as silicon oxide, silicon carbon oxide, germanium oxide, germanium carbon oxide, SiGe oxide, SiGe carbon oxide, and/or combinations thereof. In various examples, the dielectric barrier 118 is a material with between about 0 and about 1 atomic percent of one or more semiconductors (e.g., Si and/or Ge), between about 30 and about 40 atomic percent carbon, between about 10 and about 20 atomic percent oxygen, and between about 20 and about 30 atomic percent hydrogen. Accordingly, in some such examples, the material of the dielectric barrier 118 is free of any semiconductor.

By using the material formed by etching the fin 104 as a dielectric barrier 118, some examples save a step of depositing a barrier in a subsequent process. Each fabrication process, (e.g., deposition, annealing, etc.) may contribute to the thermal budget, a limit on how much the workpiece can be heated without damage, and eliminating a deposition step may leave more room in the budget for other processes. Furthermore, by forming the dielectric barrier 118 by etching the fin 104, the semiconductor composition of the dielectric barrier 118 (e.g., the semiconductor species and/or ratio of semiconductors) may be substantially similar to that of the fin 104.

Figure 8:
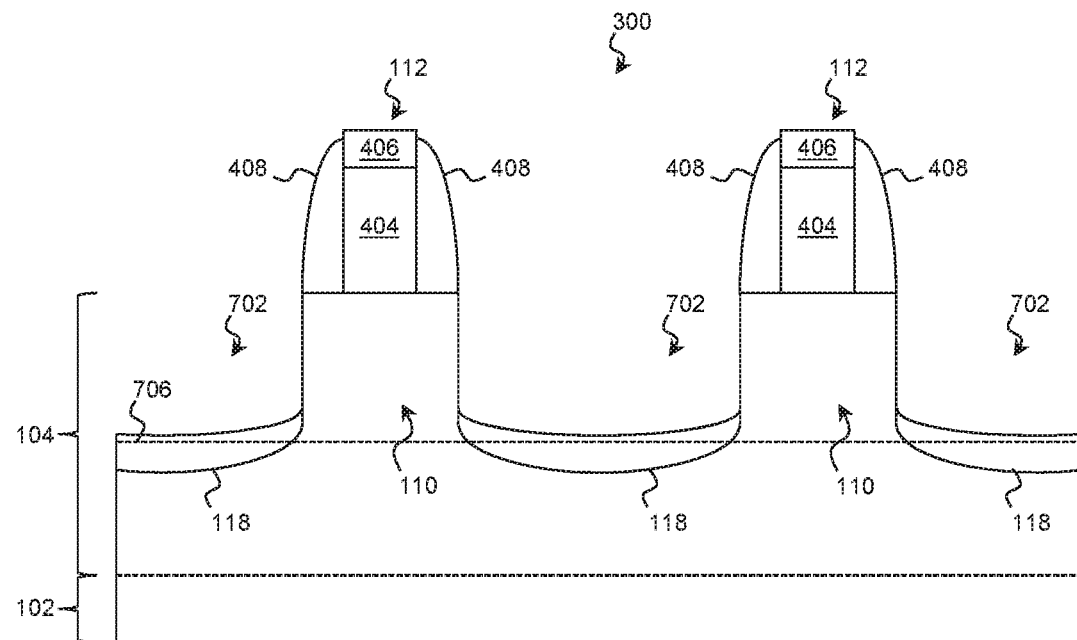

Referring to block 210 of FIG. 2 and to FIG. 8, any portion of the photoresist layer 502 remaining on the workpiece 300 is removed in a photoresist strip process. The strip process may use wet etching, dry etching, RIE, and/or ashing to remove the photoresist layer 502. The stripping of the photoresist as well as the transportation of the workpiece 300 between blocks 208 and 210 may further contribute to the formation of the dielectric barrier 118 within the source/drain recesses 702.

Because the dielectric barrier 118 may inhibit the flow of carriers through an interface between the source/drain feature 108 and the channel region 110, some of the dielectric barrier 118 may be removed from the channel region 110 interface by a cleaning process or other suitable technique. The cleaning process may include any suitable number of steps, some of which may shape the dielectric barrier 118 by removing a portion from the sides of the source/drain recesses 702 and some of which may leave the dielectric barrier 118 substantially unchanged.

In an example of the latter, referring to block 212 of FIG. 2, the source/drain recesses 702 and the remainder of the workpiece 300 may be cleaned in a first cleaning process. In contrast to an etching process, the first cleaning process may be configured to remove loosely bound films, particulate matter, and debris. The first cleaning process may use any suitable wet cleaning or dry cleaning process, and in some examples, the first cleaning process includes a wet clean where de-ionized water (DI), SC1 (de-ionized water (DI), $NH_4OH$, and/or $H_2O2$), SC2 (DI, HCl, and/or $H_2O_2$), ozonated de-ionized water ($DIWO_3$), SPM ($H_2SO_4$ and/or $H_2O_2$), SOM ($H_2SO_4$ and/or $O_3$), SPOM, $H_3PO_4$, dilute hydrofluoric acid (DHF), HF, HF/ethylene glycol (EG), $HF/HNO_3$, $NH_4OH$, tetramethylammonium hydroxide (TMAH), etc. are applied to the workpiece 300 including within the source/drain recesses 702. The workpiece 300 and/or wet cleaning solution may be agitated using ultrasonic energy or any other technique to facilitate the cleaning process. Likewise, heat may be applied to promote the cleaning.

In some embodiments, the first cleaning process is configured to spare at least some of the dielectric barrier 118 while removing other films, particulate matter, and/or debris. In an example where the wet clean uses a HF-based solution, the HF is diluted within the solution to no more than 500:1 (DI:HF) as greater concentrations of HF have been determined to remove the dielectric barrier 118. In further examples, agitation and heating are reduced to avoid removing the dielectric barrier 118. These process conditions (e.g., the specific concentration of the cleaning solution, whether to agitate and how much, whether to heat and how much, etc.) may be specifically selected to reduce the cleaning rate and make the cleaning process less time sensitive. In some examples, this is leveraged to preserve the dielectric barrier 118 within the source/drain recesses 702. In one such example, wet cleaning using dilute HF is performed for about 10 seconds to clean the workpiece 300 while preserving the dielectric barrier 118.

Referring to block 214 of FIG. 2 and to FIG. 8, the source/drain recesses 702 and the remainder of the workpiece 300 may be cleaned in a second cleaning process. As with the first cleaning process, the second cleaning process may use any suitable wet cleaning or dry cleaning process, and in some examples, the second cleaning process includes a dry clean where $O_2$, ozone, $H_2$, $NF_3$, noble gas(es), and/or other suitable cleaning chemistries are applied in a gas or plasma phase. In one such example, the second cleaning process includes a plasma cleaning process where $NF_3$ and $NH_3$ precursors are used to form $NH_4F$ and $NF_4FHF$, which are applied to the workpiece 300. The plasma cleaning process is followed by a baking process. During the plasma process, $NH_4F$ may react with native semiconductor oxides (e.g., $SiO_2$) on the workpiece 300 to form a compound that transitions to a gas form during the baking process and separates from the workpiece 300. The second cleaning process may repeat the plasma cleaning and baking for any number of cycles, and in one such embodiment, the second cleaning process includes three cycles of plasma cleaning and baking.

In contrast to the first cleaning process, in some embodiments, the second cleaning process is configured to remove a first portion of the dielectric barrier 118 from the sidewalls of the source/drain recesses 702, while leaving the bottommost portion of the dielectric barrier 118 at the base of the source/drain recess 702. Accordingly, when the corresponding source/drain feature is formed, the remaining dielectric barrier 118 will insulate the base of the source/drain feature from the remainder of the fin 104 and/or the substrate 102. The first cleaning process of block 212 and the second cleaning process of blocks 214 may thin the dielectric barrier 118, and after the cleaning processes have completed, the remaining dielectric barrier 118 may have any suitable thickness. In various examples, the final dielectric barrier 118 has a thickness at its thickest point (e.g., the thickness indicated by marker 708) between about 5 nm and about 10 nm.

Figure 9:
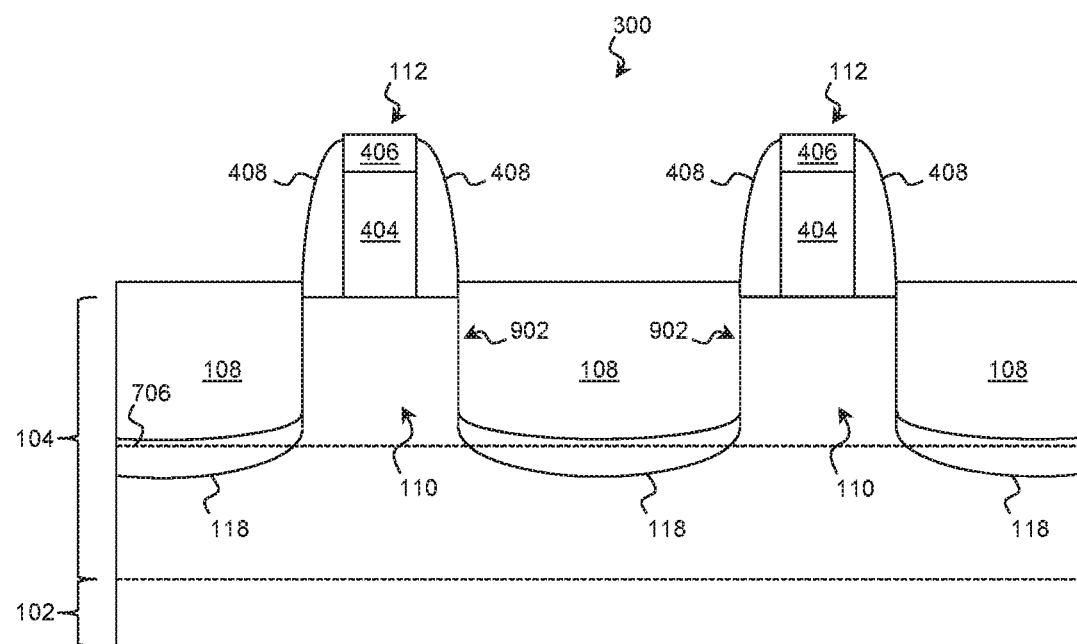
Figure 10:
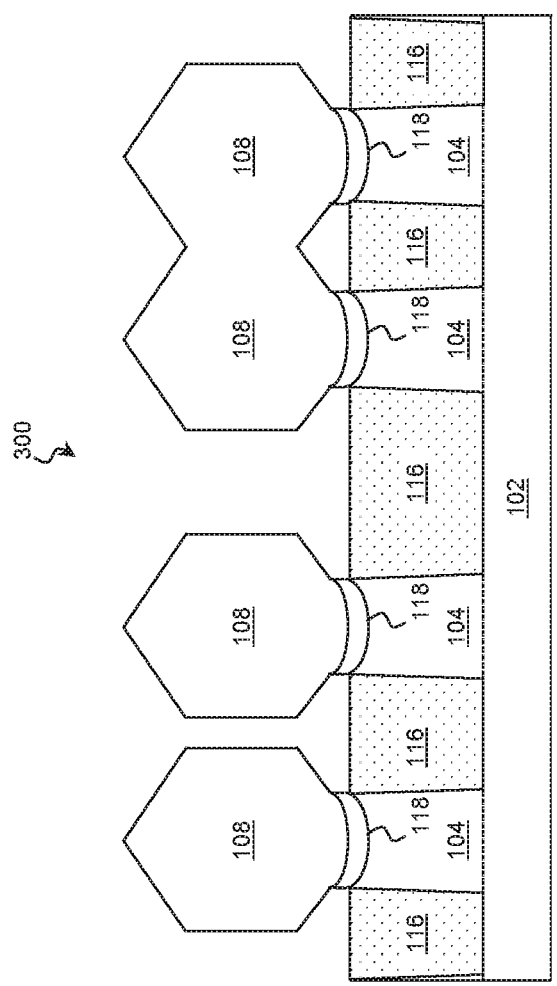
FIG. 10 is a cross-sectional view of the portion of the workpiece taken along a source/drain region according to various aspects of the present disclosure.

Referring to block 216 of FIG. 2 and to FIG. 9, an epitaxial process is performed on the workpiece 300 in order to grow source/drain features 108 within the source/drain recesses 702. The epitaxy process may include CVD deposition techniques (e.g., vapor-phase epitaxy (VPE) and/or ultra-high vacuum CVD (UHV-CVD)), molecular beam epitaxy, and/or other suitable processes to apply gaseous and/or liquid precursors, to deposit a semiconductor in a crystalline form within the source/drain features 108. The semiconductor of the source/drain features 108 may be the same as that of the device fin 104 and/or the surrounding substrate 102 or may be different in composition or structure. For example, the source/drain features 108 may include a different ratio of silicon to germanium than the device fin 104 in order to impart a strain on the channel region 110 and thereby tune carrier mobility in the channel region 110.

The source/drain features 108 may be doped with p-type dopants, such as boron or $BF_2$; n-type dopants, such as phosphorus or arsenic; and/or other suitable dopants including combinations thereof. In various examples, a SiGe-containing source/drain features 108 are implanted with boron to a concentration between about $4 \times 10^{20}$ atoms/cm$^3$ and about $9 \times 10^{20}$ atoms/cm$^3$. In further examples, a Si-containing source/drain features 108 are implanted with phosphorous to a concentration between about $3 \times 10^{21}$ atoms/cm$^3$ and about $7 \times 10^{21}$ atoms/cm$^3$. The dopants may be introduced during the epitaxial process and/or in a subsequent implantation process (i.e., a junction implant process). An annealing process may be performed on the workpiece 300 to activate the dopants, such as Rapid Thermal Annealing (RTA) and/or laser annealing.

As can be seen in FIG. 9, the bases of the source/drain features 108 are separated from the substrate 102 and the remainder of the device fin 104 by the dielectric barrier 118. The dielectric barrier 118 may prevent the flow of carriers out through the base and through the portion of the fin 104 and/or substrate 102 not under control of the gate stack 112. In this way, the dielectric barrier 118 may reduce leakage current and thereby improve device efficiency. The dielectric barrier 118 may have a curvilinear (curved) bottom surface where the bottommost point of the dielectric barrier 118 extends any distance below the top of the isolation features 106 and accordingly, the bottommost surface of the gate stack 112. In various examples, the dielectric barrier 118 extends between about 5 nm and about 10 nm below the top of the isolation features 106. In such examples, the thickness of the dielectric barrier 118 may be such that the top surface of the dielectric barrier extends above the top of the isolation features 106 and the bottommost surface of the gate stack 112.

It is further noted that the remainder of the source/drain features 108 (e.g., along the vertical sidewalls 902) are free of the dielectric barrier 118 and directly physically contact the channel region 110 of the device fin 104. In this way, carriers are free to flow through the channel region 110 from source to drain when the gate stack 112 places the device in the on state.

A corresponding cross-section through the source/drain features 108 is shown in FIG. 10. As can be seen, the bottommost surfaces of the source/drain features 108 are separated from the remainder of the fins 104 and the substrate 102 by the dielectric barriers 118. For each source/drain feature 108 and corresponding fin 104, the respective dielectric barrier 118 extends from an isolation feature 106 on one side of the source/drain feature 108 and fin 104 to an isolation feature 106 on the other sides of the source/drain feature 108 and fin 104. Thus, between the dielectric barrier 118 and isolation feature 106, there is no vertical carrier path from the source/drain feature 108 to the remainder of the fin 104 and the substrate 102.

Referring to block 218 of FIG. 2, the workpiece is provided for further fabrication. This may include replacing placeholder elements of the gate stack 112 (e.g., placeholder gate electrode 404, capping layer 406, etc.) with functional elements, forming an interconnect structure electrically coupling the FinFETs, and other suitable fabrication processes.

Figure 11:
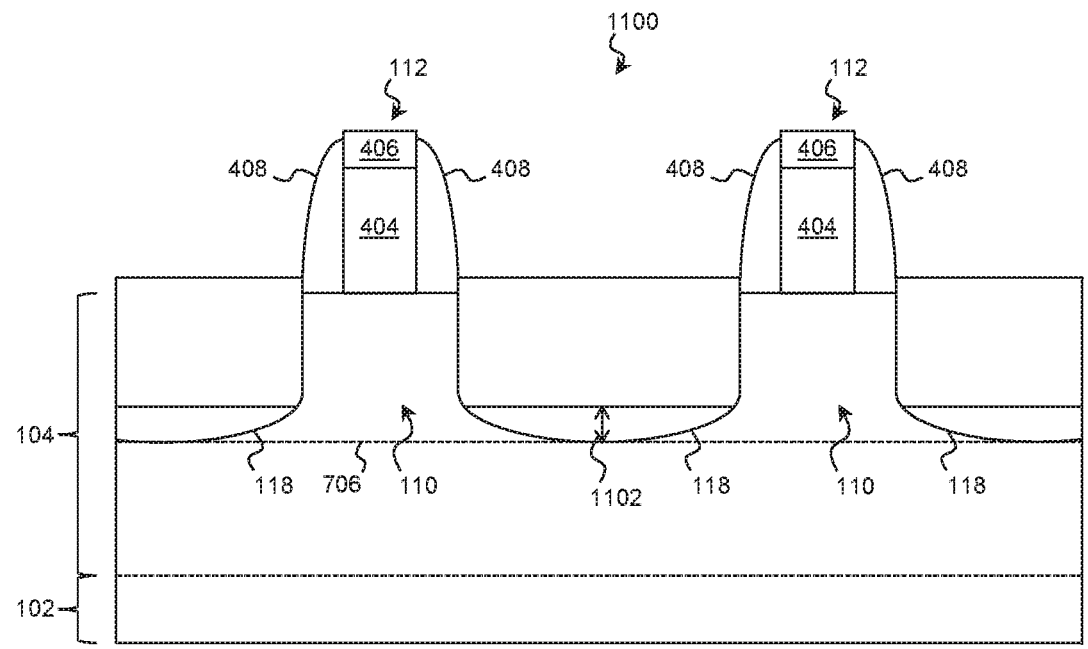
FIG. 11 is a cross-sectional view of a portion of a workpiece taken along a device fin according to various aspects of the present disclosure.

As explained above, the alignment of the source/drain recesses 702, the dielectric barriers 118, and the isolation features 106 and the gate stack 112 may be different in other examples. In some examples described with reference to FIG. 11, the etching causes bottom of the source/drain recesses 702 to be substantially coplanar with the top of the isolation features. In that regard, FIG. 11 is a cross-sectional view of a portion of a workpiece 1100 taken along a device fin according to various aspects of the present disclosure. The workpiece 1100 includes a substrate 102, fins 104, channel regions 110, gate stacks 112 (e.g., gate electrode 404, capping layer 406, gate spacers 408, etc.), and source/drain features 108 substantially similar to those described above.

The etching of block 208 may remove any suitable amount of the fin 104 to form the source/drain features 108, and in some examples, the etching is controlled to etch to a depth such that the bottom of the dielectric barrier 118 is substantially coplanar with the top of the isolation features 106 (indicated by marker 706) and accordingly, substantially coplanar with the bottommost surface of the gate stack 112 (also indicated by marker 706).

It is further noted that the top surface of the dielectric barrier 118 may have any suitable shape. In contrast to examples of FIG. 9 where the top surface of the dielectric barrier 118 is curvilinear and concave, in the examples of FIG. 11, the top surface of the dielectric barrier 118 is substantially planar. In various examples, the top and bottom surfaces are such that the dielectric barrier 118 has a thickness at its thickest point (e.g., the thickness indicated by marker 1102) between about 5 nm and about 10 nm.

Figure 12:
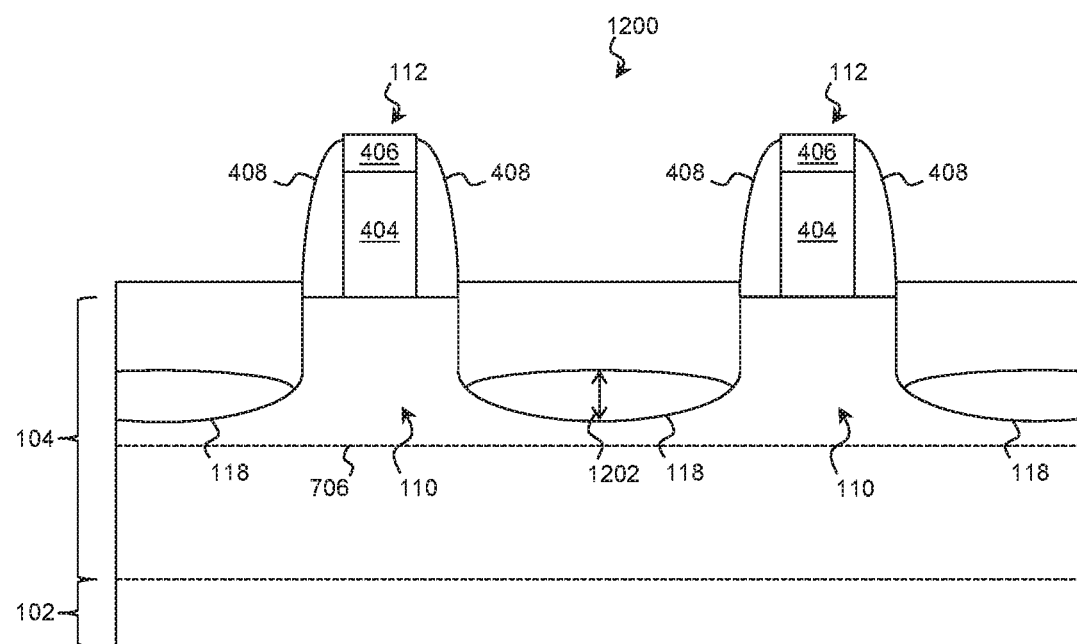
FIG. 12 is a cross-sectional view of a portion of a workpiece taken along a device fin according to various aspects of the present disclosure.

In some examples described with reference to FIG. 12, the etching causes bottom of the source/drain recesses 702 to be above the top of the isolation features. In that regard, FIG. 12 is a cross-sectional view of a portion of a workpiece 1200 taken along a device fin according to various aspects of the present disclosure. The workpiece 1200 includes a substrate 102, fins 104, channel regions 110, gate stacks 112 (e.g., gate electrode 404, capping layer 406, gate spacers 408, etc.), and source/drain features 108 substantially similar to those described above.

The etching of block 208 may remove any suitable amount of the fin 104 to form the source/drain features 108, and in some examples, the etching is controlled to etch to a depth such that the bottom of the dielectric barrier 118 is above the top of the isolation features 106 (indicated by marker 706) and accordingly, substantially coplanar with the bottommost surface of the gate stack 112 (also indicated by marker 706). The bottom of the dielectric barrier 118 may be any distance above the plane defined by the top of the isolation features 106 and the bottommost surface of the gate stack 112 and in various examples, the bottom of the dielectric barrier 118 is between about 5 nm and about 10 nm above the plane.

The top surface of the dielectric barrier 118 may have any suitable shape. In contrast to examples of FIG. 9 where the top surface of the dielectric barrier 118 is curvilinear and concave and the examples of FIG. 11 where the top surface of the dielectric barrier 118 is substantially planar, in the examples of FIG. 12, the top surface of the dielectric barrier 118 is curvilinear and convex. In various examples, the top and bottom surfaces are such that the dielectric barrier 118 has a thickness at its thickest point (e.g., the thickness indicated by marker 1202) between about 5 nm and about 10 nm.

Thus, the present disclosure provides examples of FinFET devices with a source/drain barrier and a method for forming such devices. In some examples, a method includes receiving a workpiece that includes a substrate and a device fin extending above the substrate. The device fin includes a channel region. A portion of the device fin adjacent the channel region is etched, and the etching creates a source/drain recess and forms a dielectric barrier within the source/drain recess. The workpiece is cleaned such that a bottommost portion of the dielectric barrier remains within a bottommost portion of the source/drain recess. A source/drain feature is formed within the source/drain recess such that the bottommost portion of the dielectric barrier is disposed between the source/drain feature and a remainder of the device fin. In some such examples, the cleaning of the workpiece includes a dry cleaning process configured to remove a side portion of the dielectric barrier disposed along a side surface of the source/drain recess and to leave the bottommost portion of the dielectric barrier. In some such examples, the cleaning of the workpiece further includes a wet cleaning process configured such that the dielectric barrier remains after the wet cleaning process. In some such examples, the dry cleaning process removes the side portion of the dielectric barrier such that a side surface of the source/drain feature is free of the dielectric barrier and physically contacts the channel region. In some such examples, the received workpiece further includes a gate stack disposed on and around the channel region and the etching of the portion of the device fin is performed to a depth such that a bottommost surface of the dielectric barrier extends to a depth below a bottommost surface of the gate stack. In some such examples, a topmost surface of the dielectric barrier is disposed above the bottommost surface of the gate stack. In some such examples, the received workpiece further includes a gate stack disposed on and around the channel region, and the etching of the portion of the device fin is performed to a depth such that a bottommost surface of the dielectric barrier extends to a depth substantially coplanar with a bottommost surface of the gate stack. In some such examples, the received workpiece further includes a gate stack disposed on and around the channel region, and the etching of the portion of the device fin is performed to a depth such that a bottommost surface of the dielectric barrier extends to a depth above a bottommost surface of the gate stack. In some such examples, the received workpiece further includes an isolation feature disposed alongside the device fin, and the etching of the portion of the device fin is performed to a depth such that the dielectric barrier extends below a topmost surface of the isolation feature. In some such examples, the device fin is disposed between and extends above a first isolation feature and a second isolation feature, and the dielectric barrier extends from the first isolation feature to the second isolation feature.

In further examples, a method includes receiving a substrate and a fin formed on the substrate that includes a channel region. The fin is etched to define a first source/drain recess on a first side of the channel region and a second source/drain recess on a second side of the channel region opposite the first side. A first insulating barrier is formed within a bottommost portion of the first source/drain recess and a second insulating barrier within a bottommost portion of the second source/drain recess. A first source/drain feature is epitaxially grown within the first source/drain recess on the first insulating barrier and a second source/drain feature is epitaxially grown within the second source/drain recess on the second insulating barrier. In some such examples, the first insulating barrier and the second insulating barrier are physically separated by the channel region. In some such examples, the first insulating barrier and the second insulating barrier do not extend underneath the channel region. In some such examples, the first insulating barrier and the second insulating barrier are formed by the etching of the fin to define the first source/drain recess and the second source/drain recess. In some such examples, the first source/drain recess and the second source/drain recess are cleaned after the etching of the fin and prior to the epitaxially growing of the first source/drain feature and the second source/drain feature. The cleaning is configured to leave the first insulating barrier within the bottommost portion of the first source/drain recess and the second insulating barrier within the bottommost portion of the second source/drain recess. In some such examples, the cleaning is configured to remove a first portion of the first insulating barrier along a side surface of the first source/drain recess and to leave a second portion of the first insulating barrier along a bottommost surface of the first source/drain recess.

In further examples, a device includes a substrate, and a device fin disposed on the substrate. The device fin includes a channel region, a source/drain feature adjacent the channel region, and a dielectric barrier disposed between a bottommost portion of the source/drain feature and the substrate. In some such examples, the device further includes a gate stack disposed overwrapping the channel region of the device fin such that a bottommost surface of the gate stack is disposed below a topmost surface of the device fin, and the dielectric barrier extends below the bottommost surface of the gate stack. In some such examples, a side surface of the source/drain feature is free of the dielectric barrier and physically contacts the channel region. In some such examples, the dielectric barrier does not extend underneath the channel region.

In further examples, a device includes a substrate and a fin disposed on the substrate. The fin includes a first source/drain feature, a first dielectric barrier disposed between a bottom portion of the first source/drain feature and the substrate, a second source/drain feature, a second dielectric barrier disposed between a bottom portion of the second source/drain feature and the substrate, and a channel region disposed between the first source/drain feature and the second source/drain feature. In some such examples, a side surface of the first source/drain feature is free of the first dielectric barrier and physically contacts the channel region. In some such examples, the first dielectric barrier and the second dielectric barrier do not extend underneath the channel region. In some such examples, the first dielectric barrier is physically separate from the second dielectric barrier. In some such examples, the device further includes a gate stack disposed on the channel region such that the gate stack extends below a top surface of the fin. Each of the first dielectric barrier and the second dielectric barrier extends below the gate stack. In some such examples, the device further includes an isolation feature. The fin extends above the isolation feature, and each of the first dielectric barrier and the second dielectric barrier extends below a top surface of the isolation feature. In some such examples, the device further includes an isolation feature. The fin extends above the isolation feature, and each of the first dielectric barrier and the second dielectric barrier has a bottom surface substantially coplanar with a top surface of the isolation feature. In some such examples, the fin includes a first semiconductor composition, the first dielectric barrier includes the first semiconductor composition, and the first source/drain feature includes a second semiconductor composition that is different from the first semiconductor composition. In some such examples, the device further includes: a first isolation feature disposed on a first side of the fin, and a second isolation feature disposed on a second side of the fin. The fin extends above the first isolation feature and the second isolation feature, and the first dielectric barrier extends from the first isolation feature to the second isolation feature.

In further examples, a device includes a substrate, and a device fin extending above the substrate. The device fin includes a channel region, a source/drain feature adjacent the channel region, and a dielectric barrier disposed below the source/drain feature. The dielectric barrier has a curvilinear bottom surface disposed at least partially below the channel region. In some such examples, the source/drain feature physically contacts the dielectric barrier, and the dielectric barrier physically contacts the device fin below the dielectric barrier.

In yet further examples, a method includes, receiving a workpiece that includes a substrate and a fin disposed on the substrate. The fin includes a channel region and a gate stack disposed on and around the channel region. A portion of the fin adjacent the channel region is recessed. The recessing creates a source/drain recess and forms a dielectric barrier within the source/drain recess having a curvilinear bottom surface that extends below the gate stack. The workpiece is cleaned such that a bottommost portion of the dielectric barrier that includes the curvilinear bottom surface remains within the source/drain recess. A source/drain feature is formed within the source/drain recess such that the bottommost portion of the dielectric barrier is disposed between the source/drain feature and the substrate. In some such examples, the cleaning of the workpiece includes a dry cleaning process configured to remove a first portion of the dielectric barrier disposed along a side surface of the source/drain recess and to leave the bottommost portion of the dielectric barrier.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a fin disposed on a substrate, wherein the fin has a first sidewall surface and an opposing second sidewall surface;
   a first source/drain feature disposed on the fin such that the first source/drain feature physically contacts the first sidewall surface of the fin; and
   a first dielectric barrier disposed under and interfacing with the first source/drain feature such that the first dielectric barrier prevents the first source/drain feature from interfacing with the substrate below the first dielectric barrier, wherein the first dielectric layer includes remnants of an etchant, and
   wherein a side surface of the first source/drain feature is free of the first dielectric barrier.

2. The device of claim 1, wherein the side surface of the first source/drain feature physically contacts the first sidewall surface of the fin.

3. The device of claim 1, wherein a channel region extends from the first sidewall surface to the second sidewall surface.

4. The device of claim 1, further comprising:
   a second source/drain feature disposed on the fin such that the second source/drain feature physically contacts the second sidewall surface of the fin; and
   a second dielectric barrier disposed under and interfacing with the second source/drain feature such that the second dielectric barrier prevents the second source/drain feature from interfacing with the substrate below the second dielectric barrier.

5. The device of claim 4, wherein the first dielectric barrier is spaced apart from the second dielectric barrier.

6. The device of claim 1, wherein the first dielectric barrier has a convex top surface.

7. The device of claim 1, further comprising a gate stack wrapping around the fin.

8. A device comprising:
   a semiconductor fin disposed over a substrate, the semiconductor fin having a first side surface, an opposing second side surface, and a channel region extending from the first side surface to the second side surface;
   a first source/drain feature disposed on the semiconductor fin and physically contacting the first side surface of the semiconductor fin;
   a first dielectric barrier disposed between a bottom portion of the first source/drain feature and the substrate, wherein the first dielectric barrier includes remnants of a photoresist material; and
   a second source/drain feature disposed on the semiconductor fin.

9. The device of claim 8, wherein the second source/drain feature physically contacts the second side surface of the semiconductor fin.

10. The device of claim 8, further comprising a second dielectric barrier disposed between a bottom portion of the second source/drain feature and the substrate.

11. The device of claim 8, wherein the first dielectric barrier has a planarized top surface.

12. The device of claim 8, further comprising a shallow trench isolation structure disposed on the substrate, wherein the shallow trench isolation structure has a topmost surface at a first height above the substrate, and wherein the bottom portion of the first dielectric barrier is positioned at a second height that is below the first height of the topmost surface of the shallow trench isolation structure.

13. The device of claim 8, further comprising a shallow trench isolation structure disposed on the substrate, wherein the shallow trench isolation structure has a topmost surface at a first height above the substrate, and wherein the bottom portion of the first dielectric barrier is positioned at a second height that is above the first height of the topmost surface of the shallow trench isolation structure.

14. A method comprising:

removing a portion of a fin structure to form a recess in the fin structure, wherein a dielectric barrier is formed in the recess during the removing of the portion of the fin structure, wherein the dielectric barrier includes remnants of the fin structure;

removing a first portion of the dielectric barrier such that a second portion of the dielectric barrier remains in the recess after the removing of the first portion of the dielectric barrier; and forming a source/drain feature within the recess on the second portion of the dielectric barrier.

15. The method of claim 14, wherein removing the first portion of the dielectric barrier includes performing a first treatment process and a second treatment process, the second treatment process different than the first treatment process.

16. The method of claim 14, wherein the second portion of the dielectric barrier is disposed between the source/drain feature and a substrate, and wherein the fin structure is disposed on the substrate.

17. The method of claim 14, further comprising forming a metal gate structure over the fin structure.

18. The method of claim 14, wherein removing the first portion of the dielectric barrier exposes a channel region of the fin structure.

19. The method of claim 18, wherein forming the source/drain feature within the recess includes forming the source/drain feature directly on the channel region such that the source/drain feature physically contacts the channel region of the fin structure.

20. The method of claim 14, wherein the dielectric barrier is formed in the recess during the removing of the portion of the fin structure includes forming the dielectric barrier from an etchant used during an etching process performed during the removing of the portion of the fin structure.

* * * * *